United States Patent [19]

Locher et al.

[11] Patent Number: 5,444,381

[45] Date of Patent: * Aug. 22, 1995

[54] MEASURING CIRCUIT FOR IMPEDANCE VALUES PARTICULARLY FOR USE WITH INDUCTIVE DISPLACEMENT TRANSMITTERS

[75] Inventors: Johannes Locher, Stuttgart; Werner Fischer, Heimsheim; Joerg Barth, Muehlacker-Lienzingen, all of Germany

[73] Assignee: Robert Bosch GmbH, Stuttgart, Germany

[*] Notice: The portion of the term of this patent subsequent to Apr. 13, 2010 has been disclaimed.

[21] Appl. No.: 684,885

[22] PCT Filed: May 26, 1990

[86] PCT No.: PCT/DE90/00389

§ 371 Date: Apr. 17, 1991

§ 102(e) Date: Apr. 17, 1991

[87] PCT Pub. No.: WO91/02985

PCT Pub. Date: May 7, 1991

[30] Foreign Application Priority Data

Aug. 23, 1989 [DE] Germany .................. 39 27 833.6

[51] Int. Cl.⁶ ............................................. G01R 27/02
[52] U.S. Cl. ................... 324/657; 324/207.12
[58] Field of Search ............... 324/207.11, 207.12, 324/207.16, 207.18, 207.19, 207.24, 648, 654, 656, 657, 680, 683, 706, 709; 340/870.31, 870.35, 870.36; 336/45, 75

[56] References Cited

U.S. PATENT DOCUMENTS

| | | | |
|---|---|---|---|
| 3,684,961 | 8/1912 | Moir | 324/207.19 |
| 4,191,922 | 3/1980 | Harris et al. | 324/238 |
| 4,866,378 | 9/1989 | Redlich | 324/207.19 |
| 5,045,786 | 9/1991 | Fischer | 324/207.16 |
| 5,202,628 | 4/1993 | Locher et al. | 324/207.12 |

*Primary Examiner*—Sandra L. O'Shea
*Assistant Examiner*—R. Phillips
*Attorney, Agent, or Firm*—Michael J. Striker

[57] ABSTRACT

A measuring circuit (MS) for measuring the value of an impedance in an impedance network includes an oscillator device (OSZ1), a second oscillator device (OSZ2), a phase-controlled rectifier (PG), a reference/actual value comparison point (AG) and an integrator.

The first oscillator device feeds a first alternating voltage of constant amplitude and constant frequency to a first output connection (A1). The second oscillator device feeds a second alternating voltage of the same frequency, but with adjustable amplitude and with phase shifted by 180°, to a second output connection (A2). The amplitude of the second alternating voltage depends on the phase of the signal which is transmitted to the phase-controlled rectifier via an input connection (E). If the input signal is in phase with the second output signal, the amplitude of the second output signal is reduced. However, if the input signal oscillates in opposite phase to the second output signal, the amplitude of the second output signal is increased. This change of amplitude is effected by the integrator which integrates the signal, which is rectified and compared with a reference value, and transmits the integration value as amplitude adjusting value.

9 Claims, 3 Drawing Sheets

MEASURING CIRCUIT FOR IMPEDANCE VALUES PARTICULARLY FOR USE WITH INDUCTIVE DISPLACEMENT TRANSMITTERS

BACKGROUND OF THE INVENTION

The invention is directed to a measuring circuit which can measure impedance values. An important application of such measuring circuits consists in determining, together with inductive displacement transmitters, regulating distances, whether in rotational or in linear movement, of any structural component parts. Conventional inductive displacement transmitters are half-differential short circuit ring displacement transmitters, differential choke displacement transmitters and differential transformer displacement transmitters.

In order to measure the impedance values of structural component parts not exclusively showing ohmic resistance, it is necessary to apply alternating voltage to the structural component parts. The amplitude and often also the phase of the voltage at the structural component part are then measured. The measurement signal is generally smoothed by a low-pass filter to obtain a direct voltage as final measurement value. Measuring circuits, such as are preferably used with inductive displacement transmitters, are generally constructed in such a way that the emitted direct voltage is proportional to the regulating distance of a final control element of the displacement transmitter. It is very difficult to achieve highly accurate results with conventional measuring circuits, since the low-pass filters which are employed lead to phase shifting which is difficult to take into account and/or since the obtained direct voltage still has a residual ripple.

Accordingly, it has long been a problem to further develop measuring circuits, which are particularly suited for evaluating the signals of inductive displacement transmitters, in such a way that they emit a measurement signal of particularly high accuracy which is a measure for the impedance value of a variable impedance.

SUMMARY OF THE INVENTION

The measuring circuit according to the invention comprises, as substantial function groups, a first oscillator means or device, a second oscillator means and an integrator which controls the amplitude of the alternating voltage put out by the second oscillator means or device. This alternating voltage is shifted in phase by 180° relative to the alternating voltage of the first oscillator means or device. The frequency of the two voltages is constant. Moreover, the amplitude of the voltage from the first oscillator means or device is constant. The output signal of the integrator and accordingly the amplitude of the alternating voltage of the second oscillator means depends on the amplitude and phase of a signal which is fed to an input connection of the circuit. The integration, which takes into account the amplitude and phase, is made possible by a phase-controlled rectifier and a comparison device which obtains the output signal from the rectifier as actual value signal and compares it with a reference value signal. The actuating signal formed in the comparison is integrated.

In order to measure an impedance value, an impedance network containing that impedance whose value is to be measured is connected to the measuring circuit. The network is connected at a first point with the first alternating voltage, at a second point with the oppositely phased second alternating voltage of adjustable amplitude, and at a third point with the aforementioned phase-controlled rectifier. As long as an alternating voltage occurs at the third point, the integrator obtains an input signal which is not equal to zero, so that it integrates up or down, depending on the mathematical sign of the input signal, and accordingly adjusts the amplitude of the adjustable alternating voltage. When the network is suitably selected, the voltage at the third point finally becomes zero as a result of the adjustment of the amplitude of the second alternating voltage. The integrator then remains at the achieved value, so that the amplitude of the adjustable alternating voltage also no longer changes. The impedance value of a determined impedance can be calculated from this amplitude and known characteristics of the network.

The use claims show superstructures of networks by means of which displacement signals can be evaluated as supplied by inductive displacement transmitters. These applications are explained in more detail in the following by examples illustrated by the drawings.

The measuring circuit preferably comprises a measuring output connection to which the output signal from the integrator is fed. In this case, the amplitude of the adjustable alternating signal need not be evaluated, rather the integrator signal is used as measurement signal, which integrator signal in turn determines the amplitude. This output signal from the integrator is a pure direct voltage signal without any residual ripple. Accordingly, it is a highly accurate signal which can be further processed in conventional evaluating circuits in the usual manner.

Various networks require that a determined point of the network be connected to a defined direct voltage so as to be able to measure the impedance value of a determined impedance. This direct voltage can be the ground voltage. But in those instances where a direct voltage differing from the ground voltage is desired it is advantageous that the measuring circuit comprise a direct voltage source which supplies a direct voltage to a direct voltage connection.

If the measuring circuit, according to the invention, is used together with an inductive displacement transmitter, there is the risk that hunting will occur when the displacement transmitter is adjusted quickly. In order to prevent this risk it is advantageous to equip the measuring circuit with a sample/hold element which samples the output signal of the integrator and supplies the sampled and held value to the second oscillator means for controlling the amplitude of the adjustable alternating voltage.

The use of the measuring circuit, according to the invention, is not limited to the applications described herein which concern the connection of the measuring circuit with inductive displacement transmitters. Rather, any desired impedance can be measured, that is e.g. also a pure ohmic resistance. However, it must be taken into account for all applications that the measuring circuit is connected to a network which is constituted in such a way that the input signal at the integrator runs to the value of zero, as described above, when the amplitude of the adjustable alternating voltage is adjusted by means of the output signal of the integrator.

BRIEF DESCRIPTION OF THE DRAWING

The objects, features and advantages of the present invention will now be illustrated in more detail by the following detailed description, reference being made to the accompanying drawing in which.

DESCRIPTION OF THE EMBODIMENT EXAMPLES

Figure 1:
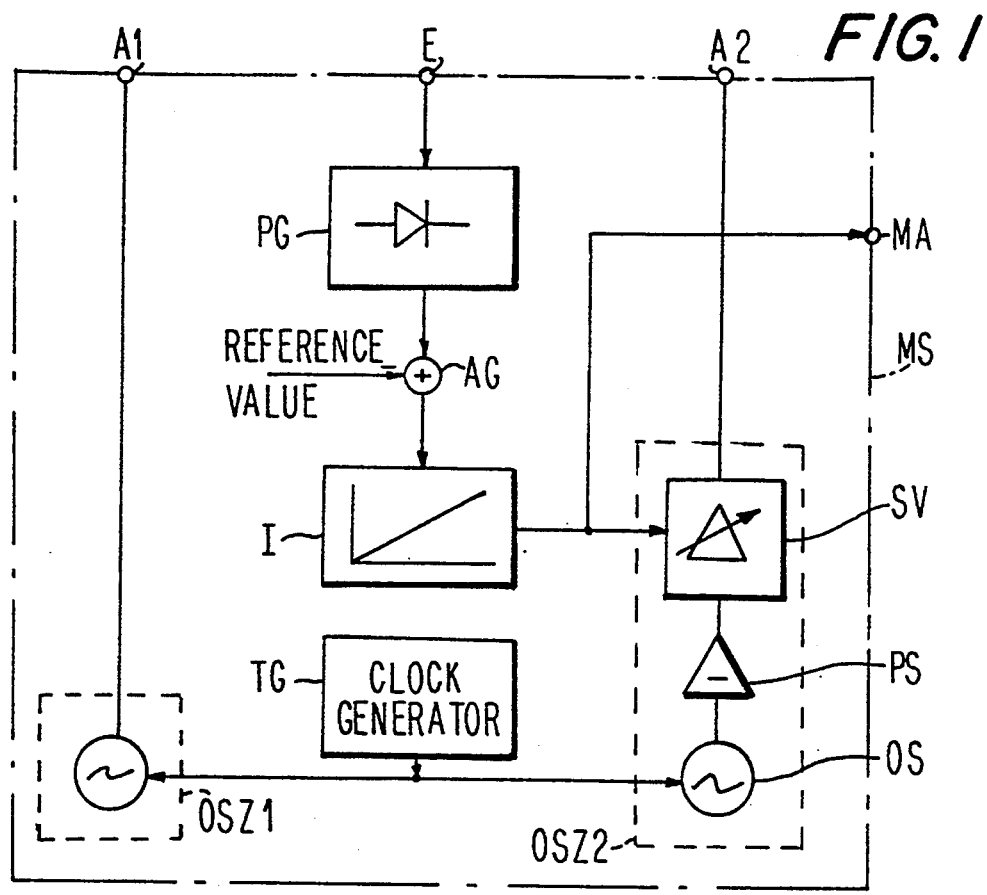
FIG. 1 shows a block wiring diagram of a measuring circuit which is suitable for use with an inductive displacement transmitter.

The measuring circuit MS shown in FIG. 1 and enclosed by a dash-dot line comprises a first output connection A1, a second output connection A2, a measuring connection MA, and an input connection E. The first output connection A1 obtains a sinusoidal alternating voltage of constant frequency and constant amplitude from a first oscillator means OSZ1. In the embodiment examples, the frequency is 10 kHz and the peak-to-peak amplitude is 4 V. This frequency is predetermined by a clock generator TG which also drives a second oscillator means OSZ2 which sends a sinusoidal alternating voltage of variable amplitude to the second output connection A2. The frequency of this oscillation corresponds to that at the first output connection A1; however, it is shifted in phase by 180° relative to the latter. The oscillation is produced by an oscillator OS, shifted in phase by 180° by a phase-shifting inverter PS, and changed in amplitude by a controllable amplifier SV. The maximum amplitude from peak to peak is 4 V.

The controllable amplifier SV mentioned above is driven by a signal which is derived from the input signal fed to the input connection E. In practical application of the circuit, this is an alternating voltage signal with the same signal shape and the same frequency as the aforementioned output signals. The input signal is rectified in a phase-controlled rectifier PG while taking into account the phase relation relative to the first output signal. The rectified signal is fed to an adder AG as actual value for regulating the amplitude of the second output signal. A reference value is subtracted from this actual value in the adder AG. The actuating signal is integrated in an integrator I whose output signal is the control signal for the controlled amplifier SV. This control signal is simultaneously fed to the measuring connection MA.

Figures 2A, 2B, 2C:
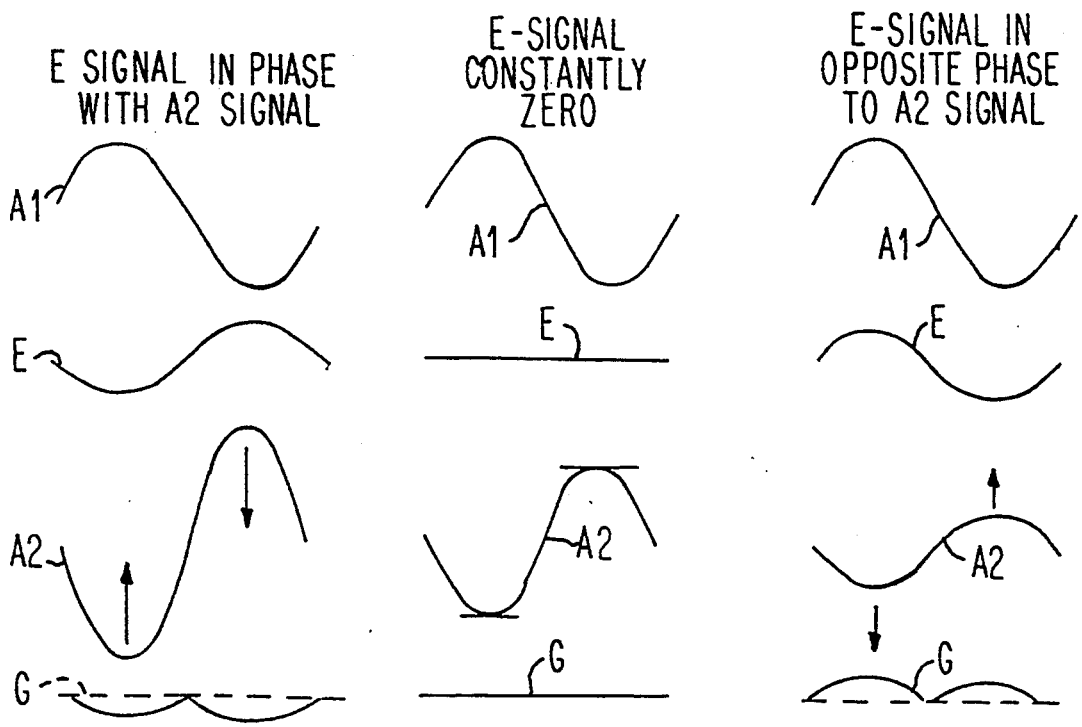
FIGS. 2a-c show three series of four time-correlated signals as they occur in the circuit according to FIG. 1 as a function of amplitude and phase of an input signal.

It is noted here that the aforementioned measuring circuit MS can only exercise a measuring function when the control loop is closed via an external impedance network, the aforementioned actual value/reference value comparison and the regulation of the amplitude of the second output signal taking place in this control loop. However, a check can be effected, also without an external impedance network, as to whether or not any measuring circuit has the functions of the measuring circuit MS described above, i.e. by first determining the output connection at which a signal of constantly fixed amplitude and frequency occurs regardless of the characteristics of other signals. In the embodiment example, this is the first output connection A1. In FIGS. 2a-2c, which relate to the different cases for the input signal, the signal at the output connection A1 is shown with the same amplitude and the same frequency.

Different input signals are now applied to input connection E in consecutive steps corresponding to FIGS. 2a-2c, i.e. an input signal which is oppositely phased relative to the first output signal according to FIG. 2a, then an input signal with constant zero level (FIG. 2b), and finally an input signal which oscillates in phase with the first output signal. The second output signal occurring at the second output connection A2 is measured at the latter. This second output signal is always oppositely phased relative to the first output signal. In the case of the oppositely-phased input signal, with reference to the first output signal, the amplitude of the second output signal is always smaller, which is indicated in FIG. 2a by corresponding arrows. In the case of the constant input signal, the amplitude of the second output signal remains unchanged (FIG. 2b). In the case of the oppositely phased input signal, the amplitude of the second output signal increases, which is shown in FIG. 2c by means of corresponding arrows.

This function of the measuring circuit MS can be used for determining the value of an impedance in an impedance network. For this purpose, the two oppositely phased output voltages are fed to the impedance network and the input signal is tapped at a suitable point. As long as the phase of the input signal corresponds to that of the second output signal at the tap, the amplitude of the second output signal is reduced, specifically until the input signal has a constant ground level. On the other hand, if the input signal has the phase of the first output signal, the amplitude is increased until the input signal again occupies the aforementioned constant level. The value of an unknown impedance can be calculated from the ratio of the amplitudes of the two output signals and predetermined characteristics of the impedance network.

Figure 3:
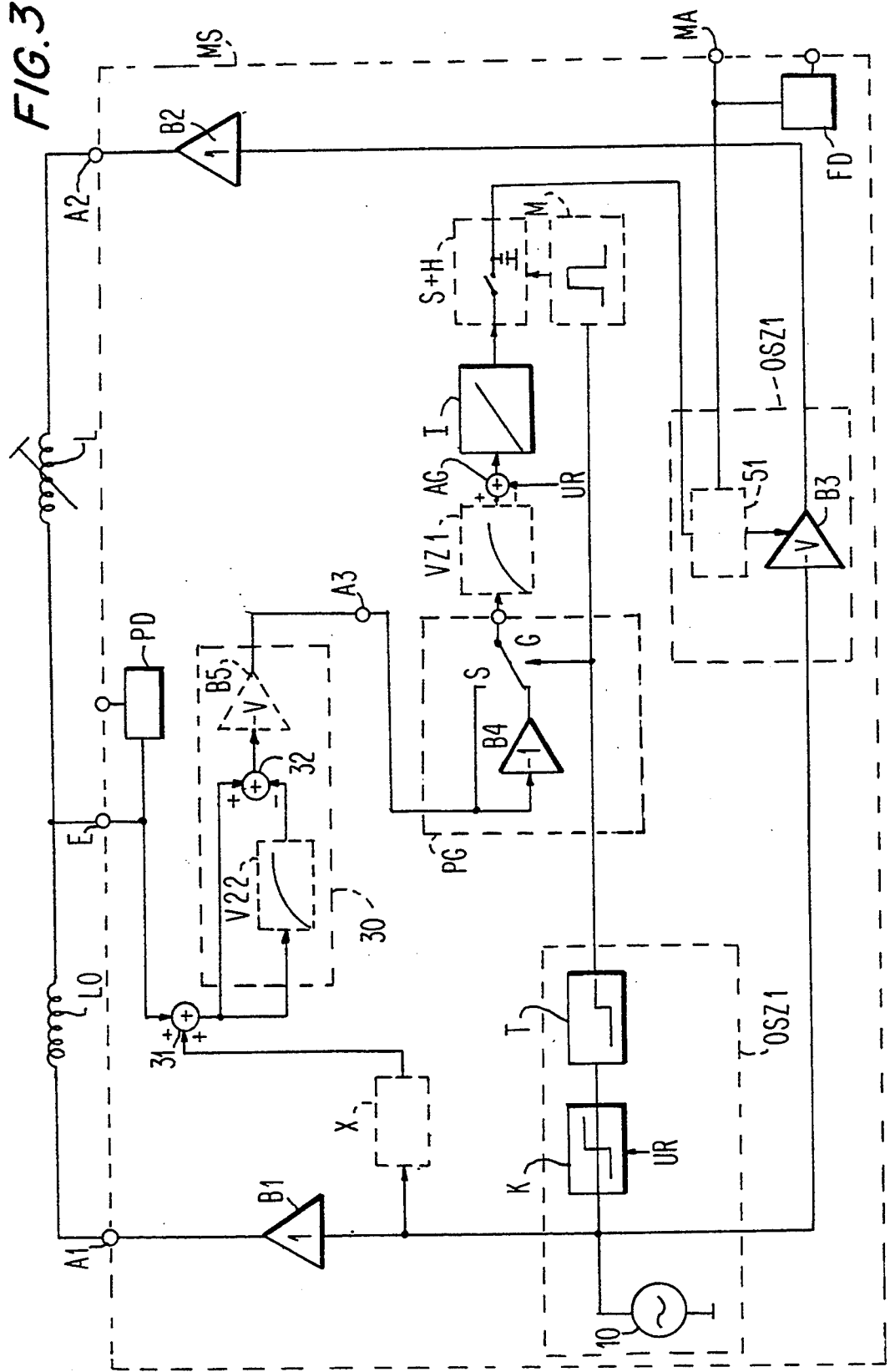
FIG. 3 shows a detailed block wiring diagram of a measuring circuit, according to FIG. 1, connected to a half-differential short circuit ring displacement transmitter.

Concrete examples are provided in the following for the procedure just described by means of FIGS. 3-5. In FIG. 3, the impedance network consists only of the two inductances of a half-differential short circuit ring displacement transmitter; in the application according to FIG. 4, the impedance network comprises the two inductances of a differential choke displacement transmitter and two known resistors; and in the application according to FIG. 5 the impedance network consists of the coils of a differential transformer displacement transmitter and two known auxiliary resistors.

FIG. 3 not only contains the wiring diagram of a half-differential short circuit ring displacement transmitter with a reference inductance L0 and an adjustable measuring inductance L, but also shows a detailed wiring diagram of a measuring circuit MS.

In the measuring circuit MS, according to FIG. 3, the first oscillator means OSZ1 comprises a sine oscillator 10, a comparator K for producing a square-wave signal by means of comparison of the sine signal with a reference voltage $U_R$ and a dead-time element T for phase shifting. The output signal from the oscillator 10 arrives at the first output connection A1 via an output amplifier B1 which provides for a low-impedance output. Moreover, the sine signal is fed to the second oscillator means OSZ2 which is realized by means of a controllable inverting amplifier B3 and a control element 51. The output signal from the oscillator means OSZ2 arrives at the second output connection A2 via a second output amplifier B2 which provides for a low-impedance output.

The signal from the input connection E is fed to an input differential amplifier 30 which contains a low-pass filter V22, an adder 32, and an inverting amplifier B5. Reference is made to FIG. 3 as regards the connection of these structural component parts. The input differential amplifier 30 serves to suppress a direct voltage which may possibly be present in the input signal, so that only the alternating voltage component is transmitted to the phase-controlled rectifier PG. This phase-controlled rectifier is formed in the embodiment example according to FIG. 3 by means of an inverting amplifier B4 and a switch S. The switch S is triggered by the square-wave signal formed by the comparator K in the first oscillator means OSZ1. The aforementioned dead-time element T serves to compensate for phase errors occurring in the measuring circuit MS in such a way that the switch S is connected with the input signal in synchronous phase. The switch S switches back and forth between the input signal and the inverting input signal. Accordingly, a signal occurs at the output connection G of the phase-controlled rectifier, as is shown in FIG. 2 for the three different described cases of the input signal. The mean value of the rectified signal is negative when the input signal oscillates in opposite phase to the first output signal, it is zero when the input signal is zero, and it is positive when the input signal oscillates in phase with the first output signal. The rectified signal is smoothed in a low-pass filter VZ1, linked in the adder AG with the reference voltage $U_R$ as reference value, and the actuating signal which is formed in this way is integrated by the integrator I. In the embodiment example, the reference signal continuously has ground potential. The output signal from the integrator I arrives at the control element 51 via a sample/hold circuit S+H. The sample/hold circuit S+H is triggered by a monostable multivibrator M which is driven by the square-wave signal formed by the comparator K. The control element 51 transforms the output signal from the integrator into an amplitude controlling signal for the inverting amplifier B3. This can be a digital signal. If the inverting amplifier B3 is drivable in analog, the integrated signal, when dimensioned in a corresponding manner, can be fed to it directly for the purpose of controlling. The control signal is also fed to the measurement connection MA.

The circuit according to FIG. 3 differs from that according to FIG. 1, among other ways, in that the two oscillator means OSZ1 and OSZ2 do not have separate oscillators, rather there is only the oscillator 10 from whose signal the second output signal is formed by means of phase inversion. It is noted that the manner in which the two output signals are produced, i.e. the first alternating voltage of fixed amplitude and fixed frequency at the output connection A1 and the second, phase-inverted alternating voltage with controlled amplitude at the output connection A2, is unimportant as regards the function of the measuring circuit MS. These alternating voltages can also be square-wave voltages with a pulse duty factor of 1:1; however, a sinusoidal signal is preferred since frequency-dependent impedances can also be measured. If the oscillator means OSZ1 and OSZ2 themselves have sufficiently low impedance, the impedance-changing output amplifiers B1 and B2 can be dispensed with.

In a corresponding manner, the differential input amplifier 30 can be omitted if the phase-controlled rectifier PG has sufficiently low impedance without the risk of an unwanted direct voltage being superposed on the input signal, e.g. from bleeder resistors in a cable harness, as can occur in practical application, e.g. in a motor vehicle.

The phase-controlled rectifier PG can be constructed as desired. The low-pass filter VZ1 can be omitted if the integrator I is constructed in such a way that it is integrated sufficiently quickly and accordingly sufficiently accurately. The sample/hold element S+H can be omitted if integration can be effected slowly based on anticipated slow changes in the input signal. However, if integration must be effected quickly, there is a risk that hunting can come about if the sample/hold element is not used.

A voltage divider X and a phase detector PD are shown additionally in the measuring circuit MS according to FIG. 3. The first output signal with reduced amplitude is fed via the voltage divider X to a summing point 31 prior to the input differential amplifier 30. The first output signal with low amplitude is accordingly superposed on the input signal. As a result, in the balanced case, i.e. when the integrator remains at the calculated value, the input signal is not a direct signal, but an alternating signal when no phase change is effected by means of the connected impedance network. The phase of the input signal is determined by means of the phase detector PD. Conclusions can be drawn about characteristics of the impedance network by means of deviations of the measured phase from the expected results. However, this application is only useful for special cases and is unimportant for the applications addressed in the following.

Finally, the measuring circuit MS, according to FIG. 3, contains an error detector FD which evaluates the amplitude control signal. If the latter runs at an upper or lower limiting value, this is the sign of a short to ground or cable break in the connected impedance network. An error is then reported accordingly. This error detector is also not important for the actual functioning of the measuring circuit MS.

In the application according to FIG. 3, a half-differential short circuit ring displacement transmitter is connected to the measuring circuit MS in the following manner. The connection point VP between the reference inductance LO and the measuring inductance L is connected with the input connection E. The free connection of the reference inductance LO is connected to the first output connection A1 and the free connection of the measuring inductance L is connected to the second output connection A2. The value of the measuring inductance L is changeable by means of rotating an adjusting shaft. It is assumed that the shaft is located in a position in which the measuring inductance corresponds to the reference inductance. Thus, if the amplitude of the signal at the second output connection A2 is greater than the amplitude at the first output connection A1 (1.7 V in the embodiment example), the input signal has the phase of the second output signal, i.e. this is the case according to FIG. 2a, which leads to a driving of the second oscillator means OSZ2 in such a way that the amplitude of the second output signal is reduced. Then, when this amplitude corresponds to that of the first output signal, this is the case according to FIG. 2b, i.e. the input signal is the zero-direct signal. The fact that the amplitude of the second output signal corresponds to that of the first shows that the measuring inductance has the same value as the reference inductance.

The following transmitter equation is true for the half-differential short circuit ring displacement transmitter:

$$L \sim s \cdot L0 \tag{G1},$$

wherein s is the regulating distance or the regulating angle of the transmitter.

In the balanced case (input voltage=0) the following evaluating equation results:

$$U\_A2/U\_A1 = L/L0 \tag{A1}$$

wherein $U\_A1$ is the amplitude of the first output signal and $U\_A2$ is the amplitude of the second output signal. It follows from equations G1 and A1 that:

$$U\_A2 \sim s,$$

i.e. the amplitude of the second output signal in the balanced case is proportional to the regulating distance or regulating angle of the transmitter. In the event that this amplitude is proportional to the amplitude of the control voltage U_MA put out by the integrator, then:

$$U\_MA \sim s.$$

In an embodiment example, the reference inductance was 7 mH and the measurement inductance was adjustable between 3.5 and 15 mH.

Figure 4:
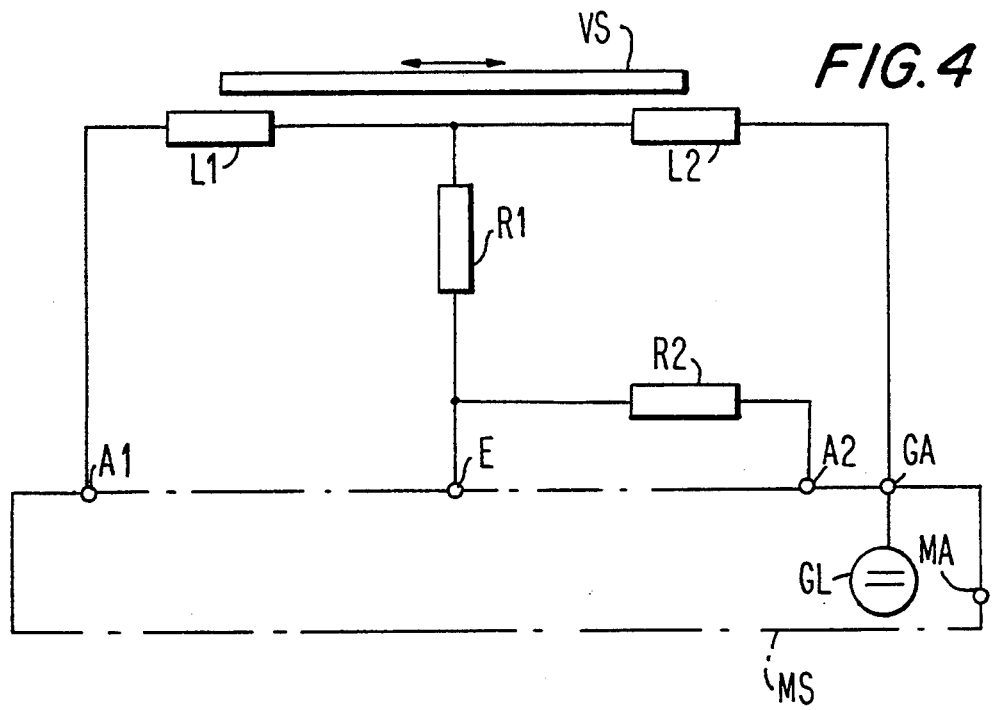
FIG. 4 shows a connection network for a differential choke displacement transmitter for connecting same to the measuring circuit according to FIG. 1.

FIG. 4 concerns the case of application in which the signal of a differential choke displacement transmitter is evaluated. This differential choke displacement transmitter comprises a first inductance L1 of two mH in the embodiment example, a second inductance L2 with the same value, and an adjusting rod VS. The indicated inductances refer to the middle position of the rod. The transmitter equation for this transmitter is as follows:

$$L1, L2 \sim s; \quad L1 + L2 = L\_GES \tag{G2}.$$

The transmitter is connected to the measuring circuit MS as follows. The connection point VP between the two inductances L1 and L2 is connected to the input connection E via a resistor R1. The free connection of the first inductance L1 is connected with the first output connection A1. A direct voltage is fed to the free connection of the second inductance L2 from a direct voltage source GL. In the embodiment example according to FIG. 4, the direct voltage source GL is part of the measuring circuit MS. Obviously, a separate direct voltage source can also be used. The direct voltage can be zero; it is preferably selected in such a way that no direct current flows through the inductances L1 and 1,2. The second output connection A2 is connected with the input connection E via a resistor R2.

The following equation applies in this construction of the impedance network:

$$\hat{U}\_VP/\hat{U}\_A1 = L2/L\_GES$$

$\hat{U}\_VP$ = amplitude of the voltage at the connection point VP.

In the balanced case, i.e. when the direct voltage is 0 at the input connection E:

$$\hat{U}\_A2 = -\hat{U}\_A1 \times R2/R1.$$

The following evaluating equation results from the two preceding equations:

$$\hat{U}\_A2 = -\hat{U}\_A1 \times L2 \, (R2/R1 \times L\_GES) \tag{A2}.$$

The following results from equations G2 and A2:

$$\hat{U}\_A2 \sim s.$$

Instead of the amplitude at the second output connection A2, the voltage U_MA is advantageously evaluated again.

Figure 5:
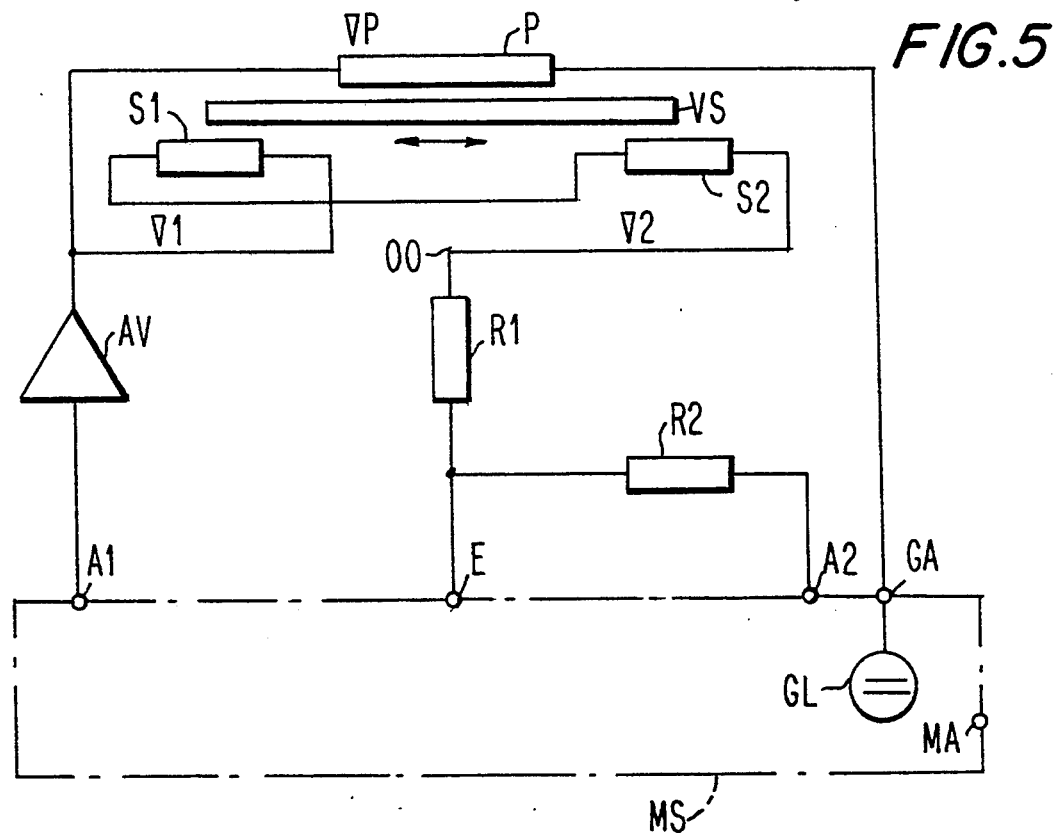
FIG. 5 shows a connection network for connecting a differential transformer displacement transmitter to the measuring circuit according to FIG. 1.

Finally, the application according to FIG. 5 relates to a differential transformer displacement transmitter which is connected to the measuring circuit MS. Such a transmitter comprises a primary winding and two anti-parallel secondary windings connected in series. The coupling between the primary and secondary sides is effected via an adjusting rod VS. The voltages $\hat{V}1$ and $\hat{V}2$ falling at the two secondary windings in the middle position of the adjusting rod VS are equal. The regulating distance s is calculated from the middle position. The following transmitter equation results:

$$\hat{V}1 + \hat{V}2 = k \times VP = \text{const}; \quad V2 - V1 \sim s \tag{G3},$$

wherein $\hat{V}P$ is the voltage amplitude on the primary side. The differential transformer displacement transmitter is connected to the measuring circuit MS in the following manner. The primary winding lies between a direct voltage connection GA and an adapting amplifier AV which obtains the signal from the first output connection A1. The free connection of the first secondary winding is also connected with this adapting amplifier. The free connection of the second secondary winding is connected with the input connection E via a resistor R1. A second resistor R2 is connected between the second output connection A2 and the input connection E. The resistors R1 and R2 have a resistance value of 10 kOhm in the embodiment example. It is noted that this also applies in a corresponding manner for the resistors R1 and R2 in the application according to FIG. 4. In a corresponding manner, an adapting amplifier AV can also be used at the output connection A1 in the application according to FIG. 4. In the embodiment example, the drive voltage is increased from 1.7 V to 4 V with this amplifier. Accordingly, there is a good signal-to-noise ratio.

With this wiring, the following evaluating equations are also applicable:

$$\hat{U}O = \hat{V}2 - \hat{V}1 + \hat{V}P,$$

wherein $\hat{U}O$ is the voltage amplitude at the end of the resistor R1 remote of the input connection E. In view of the transmitter equation G3 and the fact that $\hat{V}P = \hat{U}\_A1$, $$\hat{U}O = \hat{U}\_A1 \times s \times (2k + 1 - k).$$

In the balanced case, i.e. when the voltage at the input connection is 0, the following evaluating equation is given:

$$\hat{U}\_A2 = -\hat{U}O \times R2/R1 = \\ -\hat{U}\_A1 \times s \times (2k+1-k) \times R2/R1 \quad (A3).$$

It follows from equations G3 and A3 that:

$$U\_A2 \sim s.$$

The integration signal U_MA is also advisably evaluated again in this instance instead of the voltage amplitude Û_A2.

The embodiment examples are directed to applications in which the measuring circuit MS is used with transmitters as are particularly frequently employed in motor vehicles. However, it is noted once again that any desired impedances can be measured with the described measuring circuit when an impedance network is connected to the measuring network in such a way that the described regulating effect occurs, i.e. the integration signal runs at a fixed value. An unknown impedance value can then be measured from the ratio of the amplitudes of the two output signals and known characteristics of the impedance network. This value need not necessarily be a measurement for the path of a final control element. The measured impedance also need not necessarily be an inductance as in the embodiment examples; rather, it can also be a capacitance or a pure ohmic resistance or an impedance having ohmic, capacitive and inductive components.

While the invention has been illustrated and described as embodied in a measuring circuit for impedance values, particularly for use with inductive displacement transmitters, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed is new and desired to be protected by Letters Patent is set forth in the appended claims.

We claim:

1. Measuring circuit for measuring an impedance value, comprising:
   a first output connection (A1),
   a first oscillator means (OSZ1) connected to the first output connection (A1), said first oscillator means including means for applying a first alternating voltage having a constant amplitude and a constant predetermined frequency to the first output connection (A1),
   a second output connection (A2),
   an amplitude adjusting means (SV),
   a second oscillator means (OSZ2) connected to the second output connection (A2) and the amplitude adjusting means (SV), said second oscillator means and said amplitude adjusting means (SV) including means for feeding a second alternating voltage having an adjustable amplitude and a frequency equal to the constant predetermined frequency of the first alternating voltage to the second output connection (A2), the adjustable amplitude thereof being adjustable by the amplitude adjusting means (SV);
   means for phase shifting said second alternating voltage relative to the first alternating voltage by 180°;
   an input connection (E) for an input signal,
   a phase-controlled rectifier (PG) connected to the input connection (E) and including means for rectifying an alternating voltage component of the input signal to form a rectified signal,
   a comparison device (AG) connected to the rectifier to receive the rectified signal from the rectifier and having means for comparing the rectified signal with a reference value signal to form an actuating signal, and
   an integrator (I) connected to the comparison device (AG) to receive the actuating signal therefrom and including means for integrating the actuating signal to form an integrated signal and means for feeding the integrated signal to the amplitude adjusting means (SV) of the second oscillator means as an amplitude control signal for controlling said adjustable amplitude of said second alternating voltage, so that said adjustable amplitude depends on an impedance value of an impedance network connectable to said first output connection, said second output connection and to said input connection.

2. Measuring circuit according to claim 1, further comprising a measuring output connection (MA) connected with the integrator (I).

3. Measuring circuit according to claim 1, further comprising a direct voltage connection (GA) and a direct voltage source (GL) connected to the direct voltage connection (GA), said direct voltage source providing a direct voltage to the direct voltage connection (GA).

4. Measuring circuit according to claim 1, further comprising a sample/hold element (S+H) connected with the integrator (I) and including means for sampling the integrated signal periodically to form a sampled signal, means for storing the sampled signal and means for transmitting the sampled signal to said amplitude adjusting means for controlling said adjustable amplitude of said second alternating voltage.

5. Measuring circuit according to claim 1, further comprising:
   an element having an impedance value to be determined;
   a device having a predetermined reference impedance connected to said element at a connection point so that said element and said device are connected in series, said connection point being connected to said input connection,
   wherein said element and said device are connected across the second output connection and the first output connection so that the adjustable amplitude of the second alternating voltage at the second output connection depends on a ratio of the impedance value of the element and the predetermined reference impedance.

6. Measuring circuit according to claim 5, including a half-differential short circuit ring displacement transmitter having a control element, a variable inductance and a reference inductance, said control element acting to couple said inductances, and wherein said variable inductance comprises said element and said reference inductance comprises said device having said predetermined reference impedance, so that the regulating distance of the control element of the transmitter depends on the adjustable amplitude of the second alternating voltage.

7. Measuring circuit according to claim 1, further comprising:
   a first element having a first variable impedance,
   a second element having a second variable impedance electrically connected in series with said first element,
   means for varying said first variable impedance and said second variable impedance so that the sum of said first and second variable impedances is constant, and
   wherein said first and second elements are connected with each other at a connection point and the connection point is connected to the input connection via a first resistor, said first element has a free connection not connected to the connection point and is connected with the first output connection, and the second output connection is connected with the input connection via a second resistor, and
   means for applying a direct current voltage to the free connection of the first element, so that the adjustable amplitude of the second alternating voltage at the second output connection depends on the impedance value of the first element.

8. Measuring circuit according to claim 7, including a differential choke displacement transmitter having a control element and a first and second variable inductance and wherein said first variable inductance provides said first variable impedance and said second variable inductance provides said second variable impedance, so that the regulating distance of the control element is measured by the adjustable amplitude of the second alternating voltage at the second output connection.

9. Measurement circuit according to claim 1, further comprising a differential transformer including a primary winding, two secondary windings and a control element having a regulating distance relative to said windings and coupling the primary and the secondary windings according to the regulating distance, a transformer connection connected to one of said secondary windings on a secondary side of the transformer and another transformer connection connected to a primary winding on a primary side of the transformer, said primary and secondary windings being electrically connected in series, and means for generating a direct current voltage, and wherein for measurement of the regulating distance of the control element the transformer connection on the secondary side is connected with the input connection via a first resistor, the primary winding is connected to another one of the secondary windings at a connection point, said connection point is connected to the first output connection, the second output connection is connected with the input connection via a second resistor and the means for generating the direct current voltage is connected to the other transformer connection on the primary side, so that the regulating distance of the control element of the transmitter depends on the adjustable amplitude of the second alternating voltage at the second output connection.

* * * * *